United States Patent [19]
Camparo et al.

[11] Patent Number: 5,657,340
[45] Date of Patent: Aug. 12, 1997

[54] RUBIDIUM ATOMIC CLOCK WITH FLUORESCENCE OPTICAL PUMPING AND METHOD USING SAME

[75] Inventors: James C. Camparo, Redondo Beach; Spencer B. Delcamp, San Gabriel, both of Calif.

[73] Assignee: The Aerospace Corporation, El Segundo, Calif.

[21] Appl. No.: 636,760

[22] Filed: Apr. 19, 1996

[51] Int. Cl.$^6$ .................... H01S 3/09; H01S 1/06; H01S 1/00
[52] U.S. Cl. .................. 372/69; 372/32; 372/38; 372/70; 372/71; 372/109; 331/94.1; 250/251
[58] Field of Search .................. 372/32, 37, 38, 372/69, 70, 71, 72, 73, 75, 90, 109; 331/3, 41, 34, 26, 94.1; 250/251

[56] References Cited

U.S. PATENT DOCUMENTS

| | | | |
|---|---|---|---|
| 4,121,178 | 10/1978 | Schlossberg | 331/94.1 X |
| 4,425,653 | 1/1984 | Cutler | 372/70 |
| 4,943,955 | 7/1990 | Rabian et al. | 368/156 |
| 5,148,437 | 9/1992 | Ohtsu | 372/32 |
| 5,192,921 | 3/1993 | Chantry et al. | 331/3 |
| 5,327,105 | 7/1994 | Liberman et al. | 331/94.1 |
| 5,338,930 | 8/1994 | Chu et al. | 250/251 |
| 5,528,028 | 6/1996 | Chu et al. | 250/251 |
| 5,606,291 | 2/1997 | Verbanets | 331/3 |

OTHER PUBLICATIONS

"Evaluations of Frequency Shift and Stability in Rubidium Vapor Stablized Semiconductor Lasers", H. Furuta and M. Ohtsu Applied Optics, vol. 28, No. 17, pp. 3737–3743, Sep. 1989.

"Compact Rectangular Cavity for Rubidium Vapor Cell Frequency Standards", H.E. Williams, T.M. Kwon, and T. McClelland Proc. 27th Freq. Control Symp., IEEE, pp. 12–17, 1983.

"Towards a Miniature Laser–Pumped Cesium Cell Frequency Standard", P.J. Chantry, B.R. McAvoy, J.M. Zomp, and I. Liberman 1992 IEEE Freq. Control Symp., pp. 114–122, May 1992.

"The Principles of the Double Resonance Method Applied to Gas Cell Frequency Standards", M. Adriti and T.R. Carver Proc. of IEE, pp. 190–202, Jan. 1964.

"Spectral Profiles of Rb–D Lines" Japanese Journal of Applied Physics, vol. 14, No. 5, May 1975.

"Monte Carlo Investigation of Imprisonment of Resonance Radiation With Partial Frequency Redistribution", F. Vermeersch, V. Fiermans, J. Ongena, H.A. Post, and W. Wieme J. Phys., pp. 1933–1937, 1988.

"Experiments on a Semiconductor laser Pumped Rubidium Atomic Clock", M. Hashimoto and M. Ohtsu IEEE J. Quantum Electron, vol. QE–23, No. 4, pp. 446–451, Apr. 1987.

"On the Signal–to–Noise Ratio and Short–Term Stability of Passive Rubidium Frequency Standards", J. Vanier and L.Bernier IEEE Transactions on Instrumentation & Measurement, vol. IM–30, No. 4, pp. 277–282, Dec. 1981.

"Stabilization of the Emission Amplitude of Semiconductor Laser Diodes", V.N. Korolev, A.V. Marugin, A.V. Kharchev, and V.B. Tsaregradskii Sov. Phys. Tech. Phys., vol. 34, No. 8, pp. 863–867, Aug. 1989.

*Primary Examiner*—Brian Healy
*Attorney, Agent, or Firm*—Derrick M. Reid

[57] ABSTRACT

A stabilized atomic clock system uses a stabilized 780.2 nm pump laser for exciting rubidium-85 atoms fluorescing to optically pump rubidium-87 atoms both contained in a gas cell enclosed in a resonant microwave cavity for broadcasting a 6834.7 MHz microwave signal matched to Rb87 hyperfine ground states which are insensitive to pump laser wavelength fluctuations of the pump laser providing the fluorescence optical pumping of the Rb87 atoms to create a population imbalance sensed by a stabilized 794.7 nm probe laser transmitting a probe beam through the cell to a probe laser photodetector generating a probe laser signal used to stabilize the microwave signal to the atomic system and used to generate a constant frequency tick rate signal that is consequently insensitive to pump laser frequency drift due to reduced light shift coefficient.

18 Claims, 2 Drawing Sheets

Rubidium Atomic Clock System

Rubidium Atomic Clock System

Rb85 and Rb87 Energy Levels

RUBIDIUM ATOMIC CLOCK WITH FLUORESCENCE OPTICAL PUMPING AND METHOD USING SAME

STATEMENT OF GOVERNMENT INTEREST

The invention was made with Government support under Contract No. F04701-93-C-0094 by the Department of the Air Force. The Government has certain rights in the invention.

The invention described herein may be manufactured and used by and for the government of the United States for governmental purpose without payment of royalty therefor.

SPECIFICATION

1. Field of the Invention

The present invention relates to the field of atomic clocks. More particularly, the present invention relates to the field of optically pumped atomic clocks.

2. Background of the Invention

Precise time keeping plays a critical role in communications and navigation satellite systems. The long-term frequency stability of the atomic standards deployed in those systems can have a significant impact on overall system performance. Accurate time keeping is critical for the Global Positioning Satellite (GPS) system, where atomic clocks are deployed on the satellites. A one microsecond time error may be equal to a thousand foot positioning error. Though present atomic clock technology allows these systems to meet their specifications, future systems may require increased time accuracy.

An atomic clock uses an atomic energy transition so as to make the output frequency of the atomic clock relatively insensitive to various noise processes. In commercial lamp-based gas-cell atomic clocks, the fluorescent light from a lamp performs depopulation-optical-pumping in a resonance cell to generate the atomic clock signal. These lamp-based gas-cell clocks are the type now flown on the GPS and Milstar satellites, and are the smallest and lightest atomic clocks presently available. The disadvantage of using lamps is that only a fraction of the light is usable for depopulation optical pumping, and not all of the lamp light makes its way into the resonance cell. Consequently, lamp based clocks generate small atomic clock signals. Standard depopulation optical pumping with diode lasers is more efficient for generating atomic clock signals, due to their large photon fluence, their tunability and their narrow line width. Hence, the atomic clock signal using diode laser light is relatively large. The disadvantage to using diode lasers is that their wavelength needs to be actively stabilized in order to reduce light-shift noise in the output frequency of the clock.

Diode-laser gas-cell atomic clocks are smaller and have the potential to be more stable than conventional lamp-based gas-cell clocks. U.S. Pat. No. 4,943,955, to Rabian, et al., teaches the use of various signals generated by an atomic-beam atomic clock to generate corrections to the atomic clock that improve its timekeeping capability. A limiting factor to achieving the true potential of laser-based gas-cell atomic clocks relates to how well the laser frequency can be stabilized. Laser frequency fluctuations disadvantageously affect the atomic clock's output frequency. In an atomic clock, the output frequency provides the tick rate of the clock, so that any error change in the clock's output frequency causes the clock to either run too slow or too fast. The tick rate is the frequency of an output signal of a device providing time intervals for precise time keeping. A problem with existing diode-laser gas-cell clocks is the error introduced into the output frequency by the light-shift effect. Light shift effect is where diode laser wavelength variations are coupled to the atomic clocks output frequency. The problem of the light shift effect is that a single pumping laser has wavelength and intensity variations which cause variations in the atomic transition used to drive the tick rate of the clock tuned to that atomic transition. One straight forward technique is to engineer the laser system and supporting electronics so as to very tightly lock the pumping laser wavelength to an atomic transition for long periods of time up to many hours. A goal of the laser based atomic clock system is to reduce the light-shift coefficient, the parameter describing the coupling between laser frequency fluctuations and clock output frequency fluctuations. The atomic clock should have a low light-shift coefficient so that the atomic clock tick rate is insensitive to laser fluctuations.

U.S. Pat. No. 4,425,653, to L. S. Cutler, teaches traditional laser optical pumping in various types of atomic clock. Laser based gas cell atomic clocks employ a depopulation optical pumping process to create the atomic clock signal. In this process, the laser is tuned to a resonance of a principal atomic medium, for example, rubidium 87, or cesium 133. Following several cycles of photon absorption and photon emission, the atomic medium generates the atomic clock signal. This depopulation optical-pumping process is efficient for generating atomic clock signal, but the light shift coefficient is relatively large. For example, when the laser frequency random walks away from a center frequency of an atomic transition at the rms rate of fifty kilohertz in one hundred seconds, then in one day the clock would have a time error of about four microseconds. Here, light shift coefficient for depopulation optical pumping is about $2\times10-11/\text{MHz}$ when the normal Doppler broadening for the atomic absorption lines of interest is about five hundred MHz. This small time error is large enough to severely limit the accuracy of both Milstar and GPS systems. Prior diode laser systems have pumping wavelength fluctuations which are coupled to the atomic transition used to generate the tick rate and therefore those fluctuations are disadvantageously coupled into the atomic transition and the resulting tic rate, These and other disadvantages are solved or reduced using the present invention,

SUMMARY OF THE INVENTION

An object of this invention is to provide a fluorescence optical pumping atomic clock.

Another object of this invention is to provide an atomic clock system with a low light-shift coefficient.

Yet another object of the present invention is to provide an atomic clock having a tick rate that is insensitive to laser fluctuations.

Still another object of the invention is to provide a fluorescence optical pumping atomic clock having a stabilized laser wavelength and resulting atomic clock tick rate.

Still another object of the invention is to provide an atomic clock having a stabilized optical pump laser inducing fluorescence optical pumping of electrons from a high ground energy level to an excited energy level with fluorescence to a low ground energy levels, the electron populations in the ground energy levels being sensed by a stabilized probe laser used to generate an atomic clock signal and microwave signal for exciting the electrons from the low ground energy level to the high ground level to complete a closed loop stabilizing of the atomic clock to a predetermined frequency.

The present invention includes an atomic system having a pump laser for exciting a first gas specie then fluorescing to optically pump and excite a second gas specie to create a population imbalance between a first and second probed energy levels between which is a microwave transition excited by the microwave signal. The primary feature being the laser induced fluorescence optical pumping from the first gas specie to create a population imbalance between the two probed energy levels which are insensitive to variations of the pump laser. When this atomic system is disposed in an atomic clock system, the probe laser which measures a population imbalance between the first and second probe energy levels, is used to stabilize the microwave signal and provide a stabilized atomic clock tick rate signal which is substantially insensitive pump laser variations. The atomic system includes a stabilization controller which provides an atomic clock tick rate signal derived from the probe laser which is substantially insensitive to laser wavelength fluctuations. Laser induced fluorescence provides depopulation optical pumping without significantly affecting the microwave transition. The atomic clock system has a reduced light-shift coefficient based upon a fluorescence depopulation optical pumping process.

Laser induced fluorescence depopulation optical pumping occurs inside a resonance gas cell. The source of optical-pumping photons has a stable center frequency and the photon fluence can be made relatively large. The atomic clock's signal-to-noise ratio for laser induced fluorescence depopulation-optical-pumping is large enough to yield a short-term stability of 3×10−11. Laser induced fluorescence optical pumping has the advantage that the atomic microwave transition is not affected by, and therefore the atomic clock signal does not depend on, pump laser wavelength fluctuations. The laser induced fluorescence optical pumping may introduce a sensitivity of clock performance to laser intensity instability which may be reduced using conventional techniques.

In the preferred form of the invention, the two gas species are rubidium 85 atoms and rubidium 87 atoms suspended in a buffer gas which does not quench fluorescence. The mixture is contained within a temperature controlled resonance gas cell within a magnetic field and enclosed in a microwave cavity having a microwave broadcasting antenna. The pump laser is a 780.2 nm stabilized pump laser and excites the rubidium 85 atoms which then fluoresce to optically pump the rubidium 87 atoms. The probe laser is a 794.7 nm stabilized probe laser which senses the population of the lower of two probe ground energy levels of the rubidium 87 atoms. The probe laser is used to generate the microwave signal at 6.8347 GHz matched to the transition between the two probe ground energy levels of the rubidium 87 atoms. The microwave signal is broadcasted into the microwave cavity which includes dielectric loading and interference filtering as well as through the gas cell.

The advantage of laser induced fluorescence depopulation optical pumping is that the light-shift coefficient dependence on the pump laser wavelength fluctuations is significantly reduced. The pump laser is matched to a transition of the rubidium 85 atoms but not to transitions of rubidium 87. Consequently, pump laser wavelength fluctuations are not substantially coupled onto the atomic output frequency. These and other advantages will become more apparent from the following detailed description of the preferred embodiment.

DETAILED DESCRIPTION OF THE PREFERRED EMBODIMENT

Figure 1:
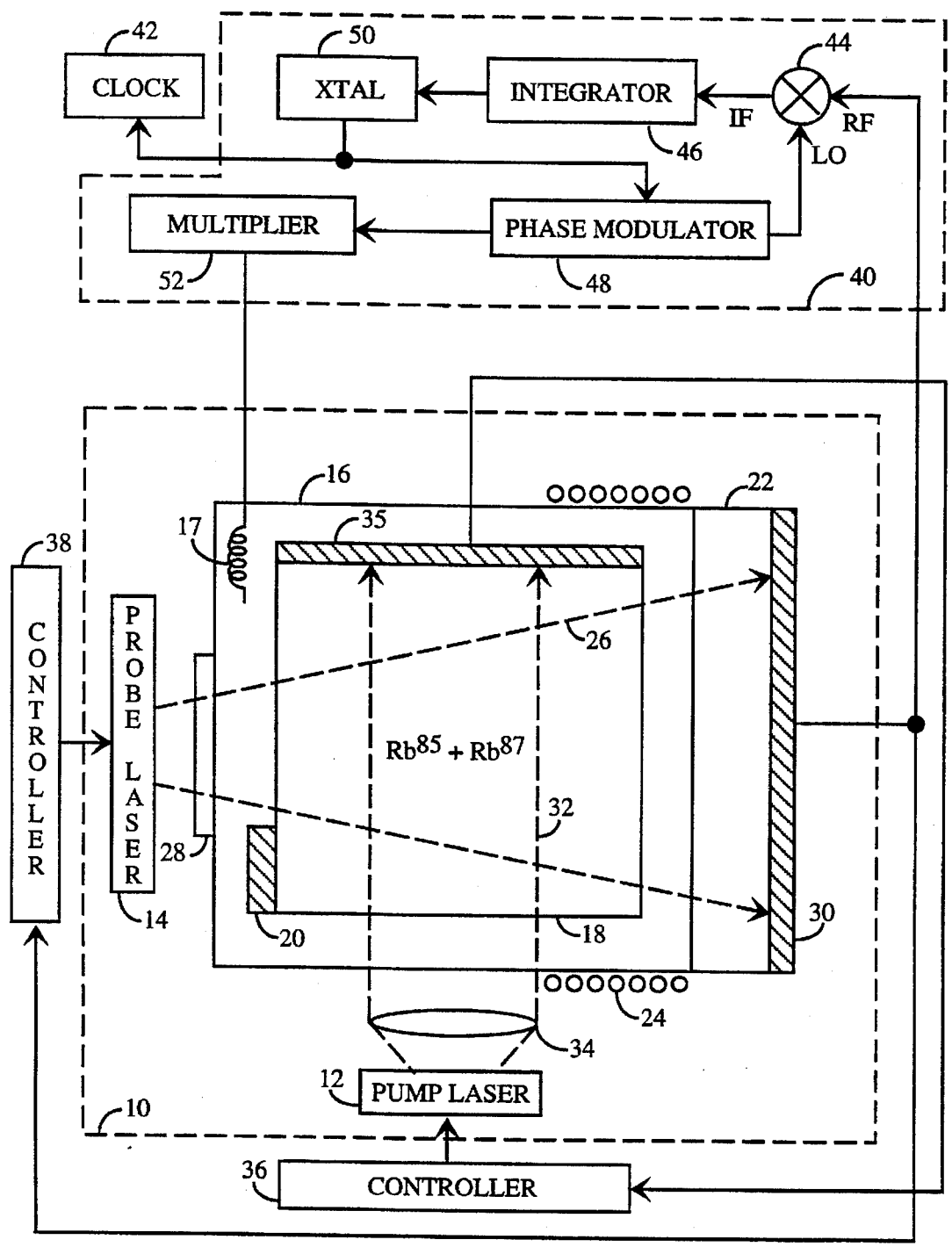
FIG. 1 is a diagram of an atomic clock system.

A preferred embodiment of the present invention is described with reference to the figures using reference designations as shown in the figures. Referring to FIG. 1, a rubidium atomic clock system has an atomic system 10 including a pump laser 12 for exciting rubidium 85 (Rb85) atoms which fluoresces to optically pump rubidium 87 (Rb87) atoms which also fluoresces and which is also excited by a microwave signal and a probe laser 14. The pump laser 12 is used for laser induced fluorescence of Rb85 atoms. The probe laser 14 is used for sensing ground state electron populations of Rb87 atoms. The pump laser 12 and the probe laser 14 are preferably a single mode AlGaAs diode laser with an output power of in the range of 5–50 mW, and 1–3 mW, respectively. A microwave cavity 16 includes a microwave antenna 17 used for broadcasting the microwave signal matched to hyperfine ground state for shifting ground state electron population. The microwave cavity may be of conventional design such as the well known Compact Rectangular Cavity for Rubidium Vapor Cell Frequency Standards. A gas cell 18 contains the rubidium 85 and 87 atoms. The gas cell 18 is preferably heated by a heater 20. The temperature of cell 16 is set by the heater 20 to optimize the re-absorption of Rb85 fluorescent photons by the process of radiation trapping. The resonance cell operating temperature is preferably between 40°–70° C. Optimum temperature is determined by buffer gas composition and pressure. The operating temperature determines the partial pressure of the rubidium vapor gas. The buffer gas is preferably neon, though other gases, such as argon, krypton, xenon may be used as well, and preferably has a pressure of between 10–40 torr. Optimum buffer gas pressure depends on buffer gas composition and resonance cell operating temperature. The gas cell 18 is preferably made of 7070 Corning glass in a rectangular shape to fit inside the microwave cavity 16. The gas cell 18 is resonance gas cell containing a mixed isotope rubidium alkali metal vapor of Rb85 and Rb87 and a non-fluorescence quenching buffer gas, such as neon. The buffer gas pressure is set to optimally enhance the re-absorption of Rb85 fluorescent photons as a consequence of pressure broadening, and also to limit diffusion of the Rb87 atoms to walls of the resonance cell 18.

Preferably, the microwave cavity 16 is a rectangular cavity loaded with a dielectric 22 and functions also as an interference filter. Around the cavity 16 is disposed a magnetic field coil 24 for generating a magnetic field within the cell 18. The probe laser 14 transmits probe beam 26 passing through an optical density filter 28 and diverging through the cell 18 and dielectric 22 to a probe photodetector 30. The optical density filter 28 is used to reduce the intensity of the probe laser beam 26. The filter 28 is an optical density filter for a 100 to 1000 reduction in probe laser intensity. Dielectric loading is set to enable a reduced size volume of the microwave cavity 16. The dielectric 22 is preferably a narrow band interference filter centered about the frequency of the probe laser 14. The dielectric 22 may be a conventional interference filter centered at the probed laser wavelength with a bandwidth of one nanometer. The pump laser 12 transmits a pump beam 32 passing through a lens 34 and propagating through the cell 18 to a pump photodetector 35. The lens 34 is used to focus pump laser light 32 through the cell 18 to the photodetector 35. The pump laser lens is an anti-reflection coated standard lens with a short focal length, such as less than one centimeter. The cell 18 provides for efficient transmission of beams 26 and 32 to the respective photodetectors 30 and 35. The photodiode 30 and 35 may be standard silicon photodiodes having a conversion efficiency of 0.3 to 0.5 amps/watt at the respective laser wavelengths.

The atomic system 10 is a means for laser pumping of Rb85 to induce fluorescence optically pumping of Rb87 atoms. The atomic clock system is stabilized at an atomic clock tick rate derived from the atomic system 10 using stabilized closed loop control. The photodetector 35 provides a pump laser signal to a pump laser controller 36 for closed loop stabilization of the pump laser at the pump laser wavelength. The probe photodetector 30 provides a probe laser signal to a probe laser controller 38 for closed loop stabilization of the probe laser at a probe laser wavelength. The controllers 36 and 38 may be of similar construction comprising respective mixers, integrators and phase modulators, not shown. Those skilled in the art know how to design stabilization controllers, such as, controllers 36 and 38. A system controller 40 is used to stabilize the atomic clock system to provide a tick rate signal to a clock 42.

Figure 2:
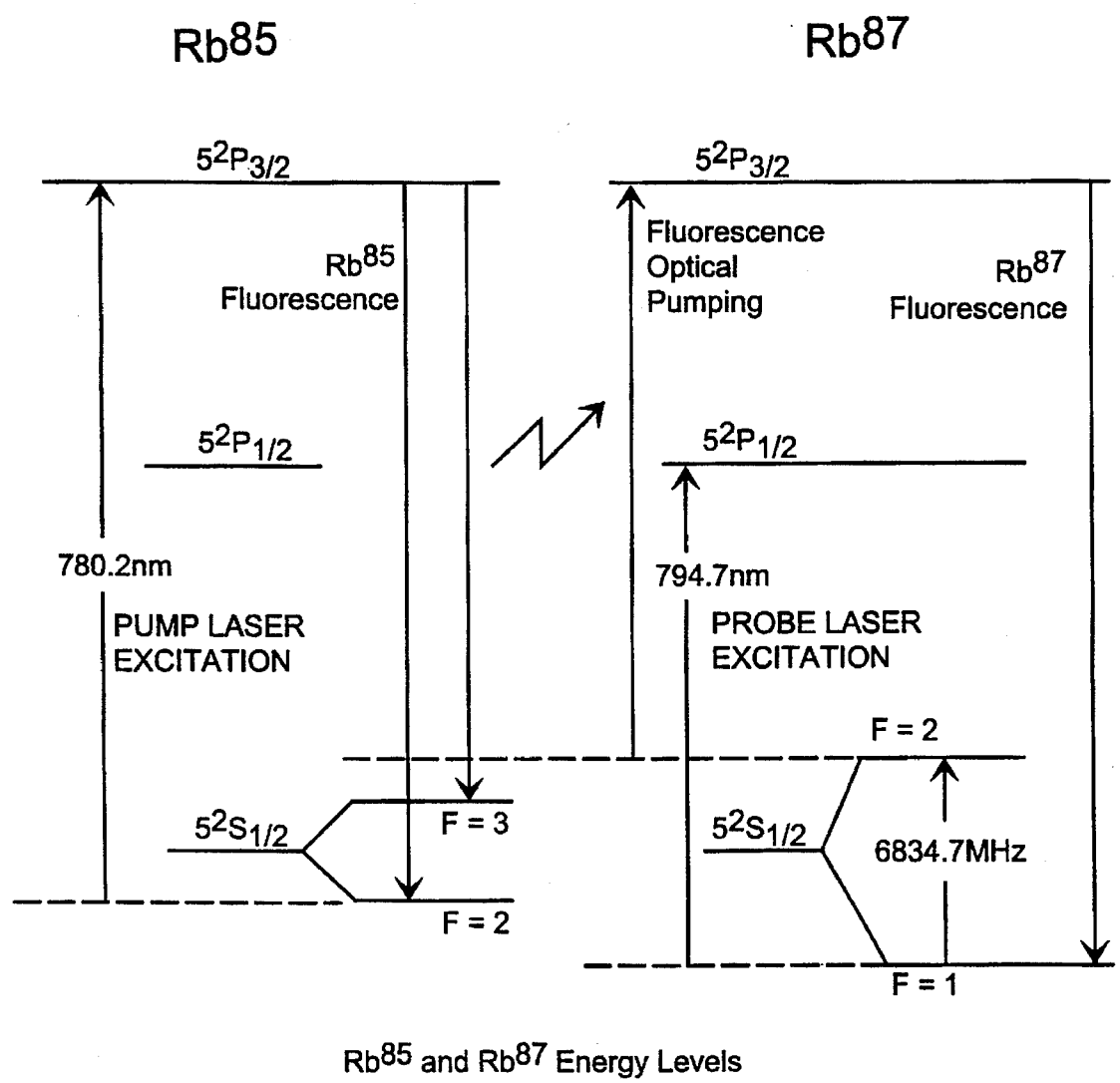
FIG. 2 is a rubidium 85 and 87 energy level diagram.

Referring to FIGS. 1 and 2, the pump diode laser 12 is tuned to the 5-2S1/2 F=2 to 5-2P3/2 transition, and excites Rb85 atoms out of their F=2 ground state hyperfine level. The pump laser 12 provides a 780.2 nm pump laser excitation for exciting F=2 electrons from ground state 5-2S1/2 to the 5-2P3/2 energy level. The laser beam 32 is tuned to the optical absorption corresponding to the naturally occurring isotope of rubidium, Rb85. After pump laser excitation, the Rb85 atoms fluoresce to either the F=2 or F=3 hyperfine energy levels of the 5-2S1/2 ground state. Transition from the 5-2P3/2 Rb85 level to the ground F=3 level produces Rb85 fluorescent photons that are absorbed by the Rb87 atoms during fluorescence optical pumping. This Rb87 absorption depopulates electrons from the Rb87 F=2 hyperfine energy level of the 5-2S1/2 ground state to the 5-2P3/2 high energy level. Natural decay from the 5-2P3/2 energy level of Rb87 can occur down to either the F=1 or F=2 5-2S1/2 ground hyperfine energy levels. After several cycles of fluorescence photon absorption and natural decay, electrons of the F=2 hyperfine level will have been efficiently depopulated to the F=1 hyperfine level. The 6834.7 MHz microwave signal broadcasted by the antenna 17 stabilizes to match the energy differential between the F=1 and F=2 hyperfine levels of the 5-2S1/2 ground state of the Rb87 atoms to transfer electron therebetween to match the depopulation caused by the fluorescence optical pumping. The probe diode laser 14 illuminates the photodetector 30 which provides: the probe laser signal to the controller 40. The controller 40 provides the atomic clock tick rate signal to the clock 42. The probe diode laser 14 is tuned at 794.7 nm to the 5-2S1/2 to 5-2P1/2 transition. When the rubidium vapor is subjected to microwave signals at the Rb87 ground state hyperfine transition frequency of 6834.7 MHz there is a change in the transmitted intensity of the probe laser beam 26. This change is used to lock the frequency of the microwave signal to the Rb87 ground state hyperfine transition.

The atomic clock system is stabilized by a system controller 40 for closed loop stabilization of the atomic clock tick rate signal used by the timekeeping clock 42. The controller 40 preferably includes a mixer 44, integrator 46, crystal oscillator 50 and a phase modulator 48 for stabilizing the tick rate signal to the clock 42 using the probe laser signal. The phase modulator 48 provides a local oscillator signal having a frequency of approximately 150 +/−50 Hz at a constant amplitude. The oscillator 50 is a voltage controlled crystal oscillator with an output frequency in the range of 100 to 150 MHz, for example, 106 MHz. The controller 40 also provides a reference signal to a multiplier 52 providing the microwave signal to the microwave antenna 17. The multiplier 52 may be a step recovery diode mounted on a wall of the microwave cavity 16. The multiplier 52 multiplies a phase modulated signal from the phase modulator 48 to generate the microwave signal. Preferably the phase modulated signal from the phase modulator 48 has a center frequency of approximately 106 MHz with 150 Hz frequency modulation, and is multiplied 64 times by the multiplier 52 then providing a 6834.7 MHz microwave signal modulated at 150 Hz. The modulated microwave signal produces a probe laser signal at about 150 Hz. The 5-2S1/2 Rb87 electron population imbalance oscillates at 150 Hz with an amplitude corresponding to the amount which the microwave signal is off the 6834.7 MHz center frequency. As the microwave signal varies from 6834.7 MHz, the 5-2S1/2 Rb87 electron population imbalance increases towards the F=1 level, increasing the DC absorption of the probe laser beam 26 to decrease the DC amplitude of the probe laser signal while the AC amplitude of the probe laser signal oscillates at 150 Hz. The probe laser signal is mixed with the 150 Hz local oscillator signal to provide a intermediate frequency signal to the integrator 46 which functions to filter a 300 Hz AC sum component signal and functions to integrate the difference component which is a DC signal of an amplitude proportional to probe laser signal. The integrator provides a control voltage signal which varies in response to changes in the amplitude of probe signal to drive the crystal 50 to the 106 MHz center frequency to thereby drive the microwave signal to the 6834.7 MHz center frequency. As the frequency of the microwave signal increases or decreases from the center 6834.7 MHz, the voltage control signal increases or decreases, respectively, to decrease or increase, respectively, the crystal frequency which in turn functions to reduce or increase, respectively, the microwave signal back towards the 6834.7 MHz center frequency. In this manner, the controller 40 stabilizes the microwave signal, and therefore the tick rate signal to a constant frequency.

The probe laser 14 is not required for optical pumping. The intensity of the probe laser 14 can be small so as to not perturb the Rb87 atoms. However, by making the cross-sectional area of the probe laser beam 26 large, the integrated signal at the probe-laser photodiode 30 can be relatively large to provide a large signal-to-noise ratio of the probe laser signal for accurate atomic clock operation. The probe laser beam 26 diverges so that its intensity is low with negligible light shift while having a large integrated detected probe laser signal. The use of the dielectric filter 22 ensures that the strong pump laser light will not contribute to shot noise in the probe laser signal. For frequency locking of the pump and probe-lasers, the laser injection current can be modulated at rates exceeding 10 KHz in the respective controller 36 and 38 for frequency locking of the pump laser 12 and probe laser 14. The microwave frequency modulation of the microwave signal is set to optimize performance, but is preferably on the order of 100 Hz so that cross-talk between the laser controllers 36 and 38 and the system controller 40 is reduced. The dielectric 22 reduces the required volume of the microwave cavity 16. The probe laser photodiode 30 is illuminated by only the transmitted probe laser light 26. The dielectric interference filter 22 keeps scattered light from the pump laser 12 and laser induced Rb85 fluorescence from illuminating the probe laser photodiode 30 which provides the probe laser signal for generating the atomic clock tick rate signal. This reduces shot noise in photodetector 30.

Frequency locking and stabilization of the diode lasers 12 and 14 is used to prevent laser drift away from the atomic resonance. The requirements on frequency locking and stability are reduced. The lasers 12 and 14 will be locked to within 100 MHz of respectively center line frequencies to ensure efficient atomic absorption of the laser light enhanced by Doppler broadening and radiation trapping.

The laser induced fluorescence optical pumping of Rb87 is significantly insensitive to pump laser wavelength fluctuations because the pump laser wavelength of the pump laser 12 is mismatched to and does not affect the F=2 and F=1 hyperfine ground energy levels of Rb87. That is, pump laser wavelength fluctuations do not affect the microserve transition between the F=2 and F=1 hyperfine ground energy levels so that the microwave transition is more stable and consequently provides a more stable tick rate signal. The laser induced fluorescence depopulation optical pumping method reduces the sensitivity of the atomic clock 42 to laser wavelength fluctuations of the pump laser 12 and 14 but may increase the sensitivity of the atomic clock to intensity fluctuations of the pump laser 12. However, diode lasers and 14 are preferably low intensity noise lasers. The pump laser beam 32 may be passed through an electro-optic modulator, not shown, prior to entering the resonance cell 18 to reduce significant amplitude fluctuations. Electro-optic modulators are well known by those skilled in the art to reduce intensity fluctuations.

The preferred form of the invention uses Rb85 and Rb87 atoms to perfect fluorescence optical pumping, but other dual gas atomic or molecular species may be used as well with suitable transitions such that the pump laser wavelength fluctuations do not affect the transition, such as the microwave transition, used to establish the frequency of the tick rate signal. In the preferred form of the invention, the probe laser 14 is matched to the transition between the 5-2S1/2 F=1 hyperfine ground state energy level and the 5-2P1/2 energy level, but could equally have been matched to the transition between 5-2S1/2 F=2 level and the 5-2P1/2 level. Additionally, the preferred electron depopulation cycle is through the 5-2P3/2 to 5-2S1/2 F=1 to 5-2S1/2 F=2 levels, in that order for Rb87 to be fluorescence optically pumped back to the 5-2P2/3 level. Other cycles could be used as well, such as, the 5-2P3/2 to 5-2S1/2 F=2 to 5-2S1/2 F=1, cycle. The particular cycle is only preferred, and other cycles using fluorescence optical pumping for decoupling pump laser wavelength fluctuations into the probe laser signal are mere variations of the present invention. The system and method of the present invention is a laser induced fluorescence optical pumping atomic system suitable for use in an atomic clock. The fluorescence optical pumping provides a probe laser signal and a derivative atomic clock signal with a reduced light shift coefficient. The atomic clock is essentially insensitive to pump laser wavelength fluctuations. Those skilled in the art of atomic systems and atomic clocks may make modifications, variations, improvements and enhancements to the preferred embodiment. But, those modifications, improvements, variations and enhancements may nonetheless fall within the spirit and scope of the following claims.

What is claimed is:

1. An atomic system for providing a probe laser signal from a microwave signal, said system comprises, a cell containing a gas comprising first atoms and second atoms suspended in a buffer gas, the first atoms having at least a pumped transition between a first pump ground energy level and a pumped energy level, a first fluorescence transition between the pumped energy level and a second pump energy level and a second fluorescence transition between the pumped energy level and the first pump energy level, the second atoms having at least a microwave transition between a first probe energy level and the second probe energy level, a fluorescence optical pumping transition between the second probe energy level and a fluorescence optical pumping energy level, a fluorescence transition between the fluorescence optical pumping energy level and the first probe energy level, and a probe transition between the first probe energy level and a probed energy level, a dielectric loaded microwave cavity resonant at the microwave signal having a dielectric disposed within the microwave cavity, a microwave antenna disposed within the microwave cavity for broadcasting the microwave signal within the microwave cavity and into the cell, the microwave signal having photon energy equal to the microwave transition for exciting electrons between the first probe energy level and the second probe energy level, a pump laser stabilized transmitting a pump laser beam through the cell, the pump laser beam having photon energy equal to the pumped transition, the pump laser creates an electron population imbalance between the first and second probe energy levels of the second atoms by exciting the first atoms fluorescing through the first fluorescence transition coupled with Doppler broadening to excite the second atoms through the fluorescence optical pumping transition, a pump photodetector for detecting the pump laser beam after propagating through the cell and providing a pump laser signal for stabilizing the pump laser, a probe laser stabilized for transmitting a probe laser beam through the cell, the probe laser beam having photon energy equal to the probe transition to sense electron population imbalance between the first and second probe energy levels, the second atoms stabilizing in a cycle through the fluorescence optical pumping transition, the fluorescence transition and the microwave transition, and a probe photodetector for detecting the probe laser beam after propagating through the cell and providing the probe laser signal for stabilizing the probe laser.

2. The system of claim 1, said system further comprises, a heating means for maintaining the temperature within the cell at a predetermined temperature, a coil means for maintaining a magnetic field within the cell at a predetermined magnetic field strength, and a probe filter for reducing the intensity of the probe laser signal prior to propagation through the cell, and a pump lens for focusing pump laser signal onto the pump photodetector.

3. The atomic system of claim 1 wherein, the first atoms are rubidium 85 atoms, the second atoms are rubidium 87 atoms, the pump laser has a wavelength of 780.2 nm, the probe laser has a wavelength of 794.7 nm, the pumped energy level is the rubidium 85 5-2P3/2 energy level, the first pump energy level is the rubidium 85 5-2S1/2 F=2 hyperfine ground energy level, the second pump energy level is the rubidium 85 5-2S1/2 F=3 hyperfine ground energy level, the pumped transition is from first pump energy level up to the pumped energy level, the first fluorescence transition is from the pumped energy level down to the first pump energy level, the second fluorescence transition is from the pumped energy level down to the second pump energy level, the fluorescence optical pumping energy level is the rubidium 87 5-2P3/2 energy level, the first probe energy level is the rubidium 87 5-2S1/2 F=1 hyperfine ground energy level, the second probe energy level is the rubidium 87 5-2S1/2 F=2 hyperfine ground energy level, the probed energy level is the rubidium 87 5-2P1/2 energy level to the fluorescence optical pumping transition is from the second probed energy level up to the fluorescence optical pumping energy level, the fluorescence transition is from the fluorescence optical pumping energy down to the first probe energy level, the microwave transition is from the first probe energy level to the second probe energy level, and the probe transition is from the first probe energy level to the probed energy level, and the microwave signal is stabilized around 6834.7 MHz.

4. The atomic system of claim 1 wherein the first atoms are molecules.

5. The atomic system of claim 1 wherein the second atoms are molecules.

6. The atomic system of claim 1 wherein the probe transition is between the second probed energy level and the probed energy level.

7. An atomic clock system for generating a tick rate signal for a clock, said system comprises, a cell containing a gas comprising first atoms and second atoms, the first atoms having at least a pumped transition between a first pump energy level and a pumped energy level, a first fluorescence transition between the pumped energy level and a second pump energy level and a second fluorescence transition between the pumped energy level and the first pump energy level, the second atoms having at least a microwave transition between a first probe energy level and a second probe energy level, a fluorescence optical pumping transition between the second probe energy level and a fluorescence optical pumping energy level, a fluorescence transition between the fluorescence optical pumping energy level and the first probe energy level, and a probe transition between the first probe energy levels and a probed energy level, a microwave means for broadcasting a microwave signal into the cell, the microwave signal having photon energy equal to the microwave transition for exciting electrons between the first and second probe energy levels, a pump laser transmitting a pump laser beam through the cell, the pump laser beam having photon energy equal to the pumped transition, the pump laser creates an electron population imbalance between the first and second probe energy levels of the second atoms by exciting the first atoms fluorescing through the first fluorescence transition with Doppler broadening to excite the second atoms through the fluorescence optical pumping transition, a pump photodetector for detecting the pump laser beam after propagating through the cell and providing a pump laser signal for stabilizing the pump laser, a probe laser transmitting a probe laser beam through the cell, the probe laser beam having photon energy equal to the probe transition to sense electron population of the first probe energy level, the second atoms stabilizing is a cycle through the fluorescence optical pumping transition, the fluorescence transition and the microwave transition, a probe photodetector for detecting the probe laser beam after propagating through the cell and providing a probe laser signal for stabilizing the probe laser, and a controller means for receiving the probe laser signal and providing the tick rate signal and the microwave signal stabilizing to the microwave transition.

8. The system of claim 7 wherein the microwave means comprises, a microwave cavity means for enclosing the cell and propagating the microwave signal through the cell, a dielectric means disposed within the microwave cavity for resonating the microwave signal within the microwave cavity and for filtering the pump laser means from the probe photodetector, and a microwave antenna means disposed within the microwave cavity for broadcasting the microwave signal within the microwave cavity.

9. The system of claim 7 further comprises a probe laser controller means from stabilizing the probe laser at the probe laser signal, and a pump laser controller means for stabilizing the pump laser at the pump laser signal.

10. The system of claim 7 further comprising, a heating means for maintaining the temperature within the cell at a predetermined temperature, and a coil means for maintaining a magnetic field within the cell at a predetermined magnetic field strength.

11. The system of claim 7 wherein, the first atoms are rubidium 85 atoms, and the second atoms are rubidium 87 atoms.

12. The system of claim 7 wherein the controller comprises, a mixer means for a local oscillator signal with the probe signal and providing an intermediate frequency signal, an integrator means for receiving the intermediate frequency signal and providing a voltage output signal, an oscillator means providing the tick rate signal controlled the voltage output signal, a phase modulator means for providing the local oscillator signal and divisor signal, and a multiplier means for multiplying the divisor signal into the microwave signal.

13. The system of claim 7 further comprises a probe filter means for filtering the probe laser signal prior to propagation through the cell, and a pump lens means for focusing pump laser signal onto the pump photodetector.

14. A method of providing a tick rate signal of an atomic clock, said method comprising the steps of, containing a gas comprising first atoms and second atoms, the first atoms having at least a pumped transition between a first pump energy level and a pumped energy level, a first fluorescence transition between the pumped energy level and a second pump energy level and a second fluorescence transition between the pumped energy level to the first pump energy level, the second atoms having at least a microwave transition between a first probe energy level and a second probe energy level, a fluorescence optical pumping transition between the second probe energy level and a fluorescence optical pumping energy level, a fluorescence transition between the fluorescence optical pumping energy level and the first probe energy level, and a probe transition between the first probe energy level a probe energy level, broadcasting a microwave signal through the gas, the microwave signal having photon energy equal to the microwave transition for exciting electrons between the first and second probe energy level, transmitting a pump laser beam through the gas, the pump laser beam having photon energy equal to the pumped transition, the pump laser creates an electron population imbalance between the first and second probe energy levels of the second atoms by exciting the first atoms fluorescing through the first fluorescence transition with Doppler broadening to excite the second atoms through the fluorescence optical pumping transition, photodetecting the pump laser beam into a pump laser signal after propagating through the gas, feeding back the pump laser signal for stabilizing the pump laser beam, transmitting a probe laser beam through the gas, the probe laser beam having photon energy equal to the probe transition to sense electron population in the first probe energy level, the second atoms stabilizing is a cycle through the fluorescence optical pumping transition, the fluorescence transition and the microwave transition, photodetecting the probe laser beam into a probe laser signal after propagating through the gas, feeding back the probe laser signal for stabilizing the probe laser beam, and generating the tick rate signal and the microwave signal from the probe laser signal, the microwave transition serving to stabilize the tick rate signal, microwave signal and probe laser signal.

15. The method of claim 14 further comprising, a heating the gas to a predetermined temperature, and inducing a magnetic field through the gas within a predetermined magnetic field strength.

16. The method of claim 14 wherein, the first atoms are rubidium 85 atoms, and the second atoms are rubidium 87 atoms.

17. The method of claim 14 wherein the generating step comprises the steps of, a mixing a local oscillator signal with the probe laser signal and providing an intermediate frequency signal, integrating the intermediate frequency signal and providing a voltage output signal, controlling an oscillator signal controlled by the voltage output signal, providing a tick rate signal from the oscillator signal, phase modulating the oscillator signal to provide the local oscillator signal and a divisor signal, and multiplying the divisor signal into the microwave signal.

18. The method of claim 14 further comprising the steps of attenuating the intensity of probe laser beam prior to propagation through the gas, and focusing pump laser signal prior to photodetecting the pump laser beam.

* * * * *